United States Patent [19]

Hokanson et al.

[11] Patent Number: 4,718,164

[45] Date of Patent: Jan. 12, 1988

[54] APPARATUS FOR ALIGNING WIRES TO SOLDER PADS

[75] Inventors: John M. Hokanson; Ronald Weispfenning, both of Hutchinson, Minn.

[73] Assignee: Hutchinson Technology Inc., Hutchinson, Minn.

[21] Appl. No.: 919,074

[22] Filed: Oct. 15, 1986

[51] Int. Cl.$^4$ .................... H05K 13/00; H05K 13/06
[52] U.S. Cl. ........................................ 29/840; 29/760; 29/850
[58] Field of Search ................ 29/760, 840, 846, 850, 29/860

[56] References Cited

U.S. PATENT DOCUMENTS

| | | |
|---|---|---|
| 3,463,898 | 8/1969 | Takaoka et al. |
| 3,608,190 | 9/1971 | Steranko et al. ...................... 29/850 |
| 3,626,590 | 12/1971 | Miller ...................................... 29/850 |
| 4,461,946 | 7/1984 | Kratschmer . |

Primary Examiner—Howard N. Goldberg
Assistant Examiner—Taylor J. Ross
Attorney, Agent, or Firm—Vidas & Arrett

[57] ABSTRACT

A wire guide device includes a base fixture to which a microelectronic component is fixedly attached such that solder pads on the component are exposed. A lacette consisting of a plurality of spaced, upstanding posts is positioned adjacent the microelectronic component such that the posts are aligned with the solder pads. Fine wire is directed around the posts over the solder pads to a wire guide. The wire guide holds each laced wire in position for soldering.

4 Claims, 4 Drawing Figures

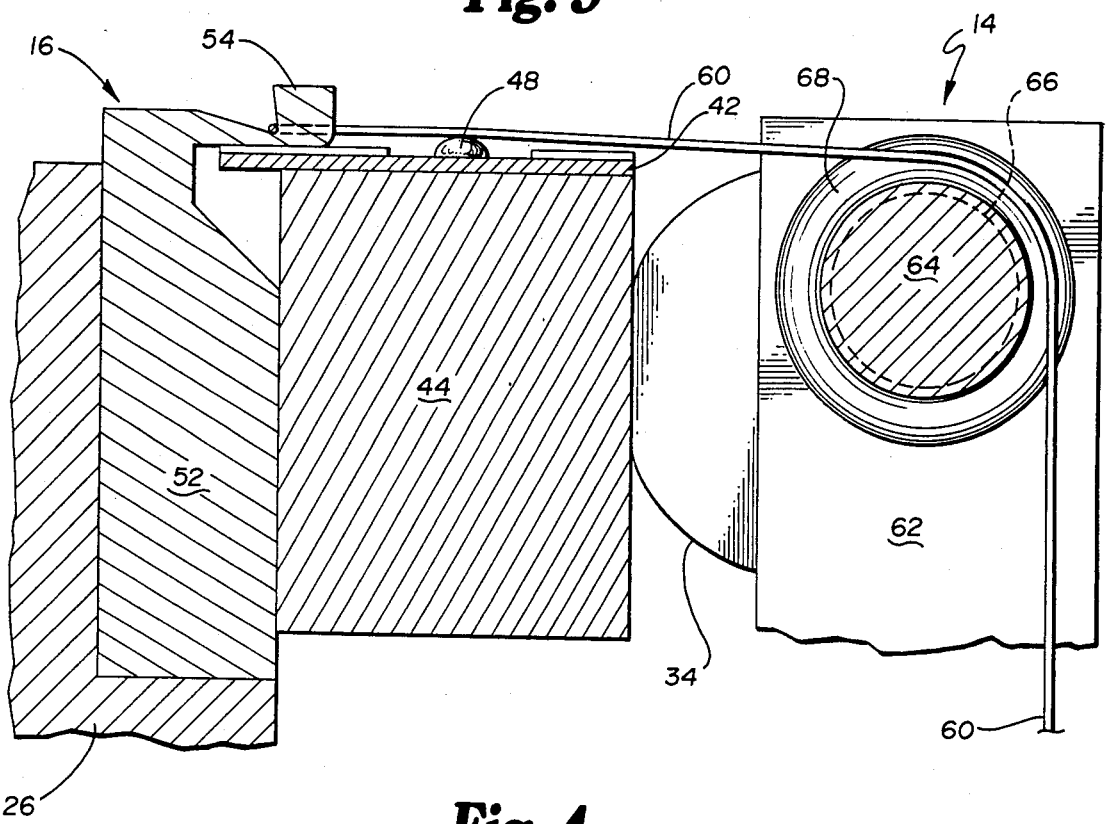
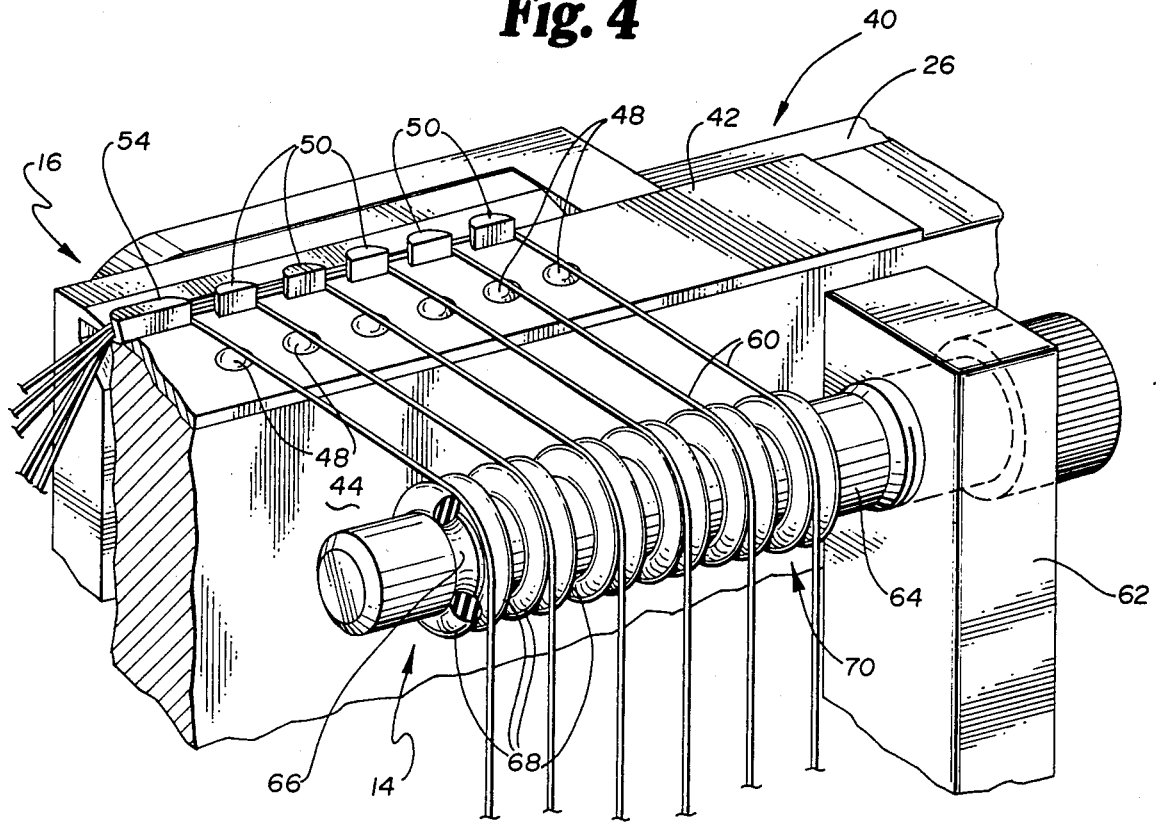

APPARATUS FOR ALIGNING WIRES TO SOLDER PADS

FIELD OF THE INVENTION

This invention relates to wire soldering and more particularly to an apparatus and method for aligning a plurality of fine wires over individual solder pads on a workpiece.

BACKGROUND OF THE INVENTION

Microelectronic components typically utilize very fine wires which must be soldered or otherwise connected to pads on microelectronic components. Delicate wires are usually held manually in position over the individual solder pads. Since many components have a plurality of solder pads, the process must be repeated over and over again since it is very difficult for an operator to manually position more than one wire across its own solder pad at one time.

The fineness of the wires involved makes them very prone to damage if too much tension is applied to the wire. Additionally, if the part is to be soldered by virtually semiautomatic or automatic process the operator's hands must be removed from the vicinity of the wires and components. If only one wire may be positioned at one time by an operator, this necessitates repeated passes of the same component through the semiautomatic or automatic apparatus.

BRIEF SUMMARY OF THE INVENTION

The apparatus of the invention provides a base fixture which rigidly holds the workpiece to which wires are to be attached by soldering. The apparatus also includes a lacette which includes a plurality of upstanding posts which are spaced such that a wire bent around each post will be centered over a corresponding solder pad on the workpiece. The apparatus further includes a guide which holds each of the wires leading from a post on the lacette position under a safe tension.

In the preferred form, the fixture is constructed and arranged such that a workpiece may be positioned to a portion of the fixture which may then be locked into position adjacent the wire guide. A lacette having the desired number of posts, each which are spaced apart in accordance with the spacing of the solder pads, is aligned to the workpiece. The wires may then be individually laced around the posts over the solder pads and over the guide such that each of the wires are centered over the solder pads with a slight tension being applied by virtue of the guide. Soldering may then be accomplished by hand or with an automatic or semiautomatic apparatus. After the solder joints have been made, the workpiece is removed from the apparatus and another workpiece may be loaded.

BRIEF DESCRIPTION OF THE DRAWINGS

A detailed description of the invention is hereafter described with specific reference being made to the drawings in which:

FIG. 3 is a sectional elevation of the apparatus of FIG. 1 through Lines 3—3; and FIG. 4 is a perspective partial view of the apparatus of FIG. 1 showing the lacette, guide and workpiece enlarged.

DETAILED DESCRIPTION OF THE INVENTION

Figure 1:
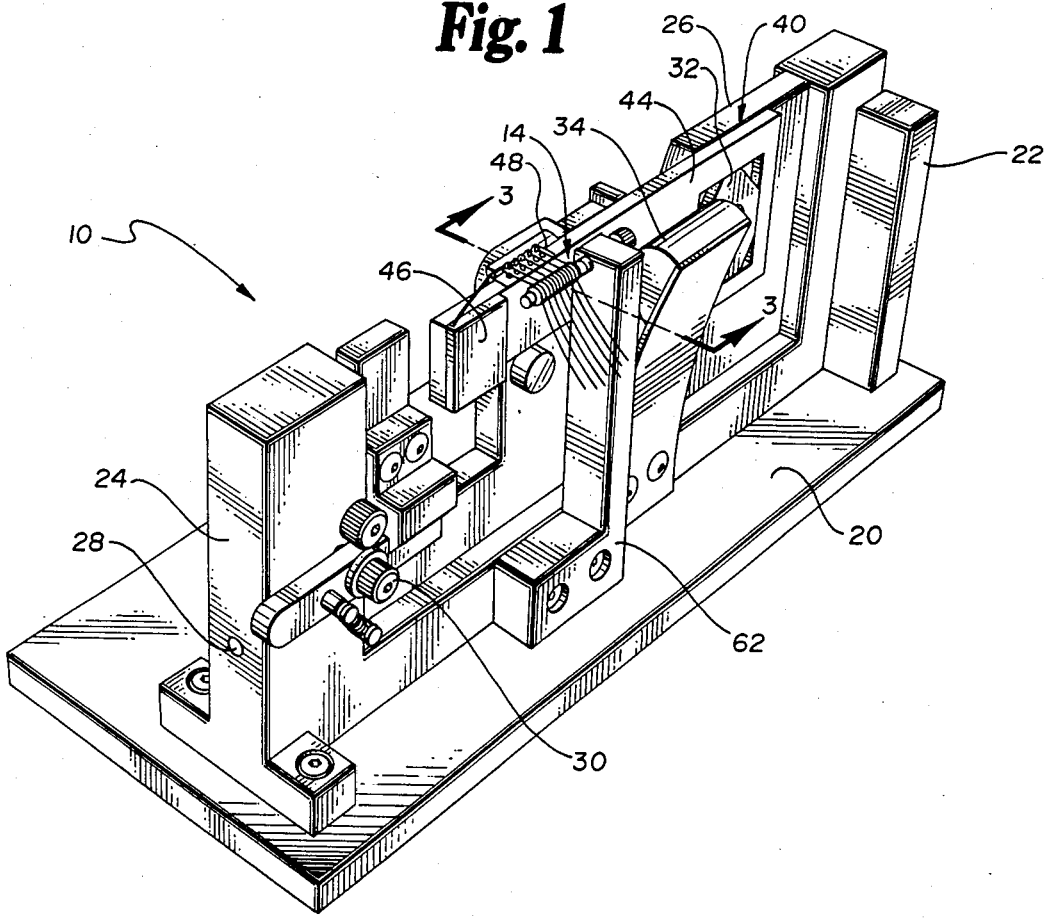
FIG. 1 is a perspective view of the preferred embodiment in the invention loaded with a workpiece.
Figure 2:
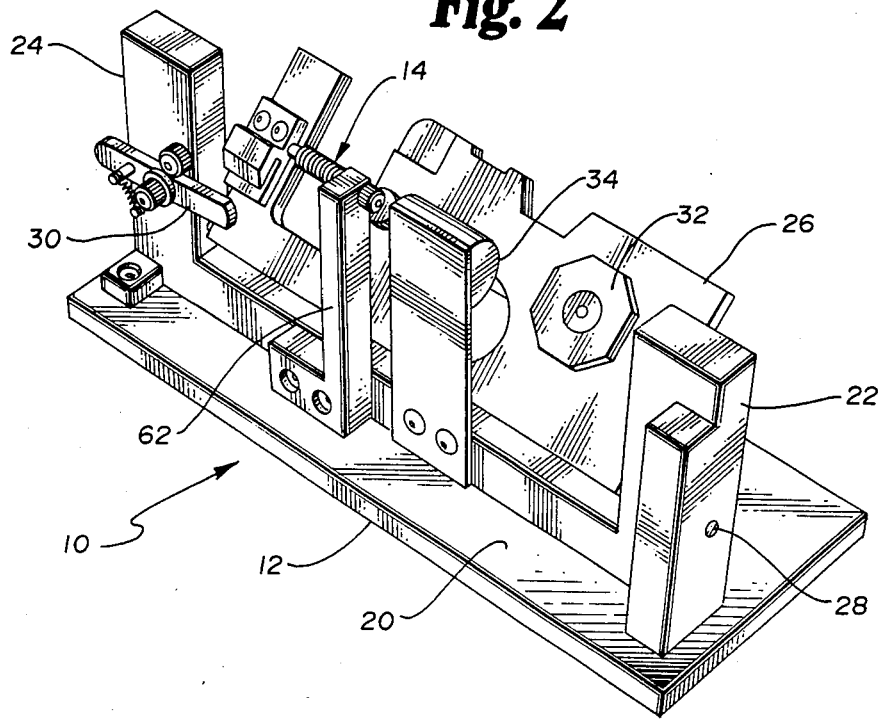
FIG. 2 is a perspective view of the apparatus of FIG. 1 showing that the fixture and guide in an unlocked position.

As best shown in FIGS. 1-3, the preferred form of the invention includes an apparatus 10 having a fixture 12, guide 14 and lacette 16.

As best shown in FIG. 2, fixture 12 includes a base plate 20 from which pivot stands 22 and 24 extend. A pivot plate 26 is pivotally mounted to pivot stands 22 and 24 by means of pivots 28. A latch 30 is provided to securely hold pivot plate 26 in an upright position when latched.

Pivot plate 26 is designed so as to accept and hold a workpiece 40 such that the workpiece may be rigidly held to fixture 12. The particular workpiece 40 depicted includes a flexible circuit 42, body 44, source of wires to be soldered 46 and a plurality of solder pads 48.

Fixture 12, as shown, is constructed and arranged such that a hub 32 engages a portion of body 44 of the workpiece 40. Other aligning means may also be employed such that the workpiece to be soldered will be aligned where desired on the pivot plate. Additionally, a spring 34 attached to the fixture applies pressure to the workpiece when the pivot plate is latched so as to urge the workpiece firmly against the pivot plate.

A lacette 16 is positioned between pivot plate 26 and workpiece 40 such that each of the upstanding posts or loom cleats 50 may be aligned with each of the spaced solder pads 48 of the workpiece. As best shown in FIG. 3, each of the upstanding posts are cantilevered over flexible circuit 42 from body 52 of the lacette. Loom cleats 50 extend perpendicularly from the solder pad bearing surface of the workpiece 40. A larger gathering cleat 54 is preferably included as shown. All of the wires to be used pass gathering cleat 54 and individual wires each bend past a separate loom cleat 50 as shown. In the most preferred form, loom cleats 50 have a quarter round cross-section such that wire turns the 90 degree angle from the gathering cleat across the solder pad in a relatively smooth arc so as to minimize the possibility of damage to the wire.

Wire 60 passes around loom cleats 50 over solder pads 48 and is directed to guide 14 as shown in FIG. 4. Guide 14 includes a mounting block 62 which is secured to base plate 20. A shaft 64 is attached to mounting block 62 such that the longitudinal axis of the shaft is parallel to the line described by the solder pads. Shaft 64 includes a number of grooves 66. O-Rings 68 are positioned over shaft 64 such that they rest in groove 66. The o-rings are arranged in pairs such that a relatively narrow gap is formed between paired o-rings. The paired o-rings are spaced on the grooves at the same spacing as the solder pads such that a wire 60 may be routed from a loom cleat across the solder pad into the slot 70 between o-ring pairs. The wire is then snugly held within slot 70 which provides a proper amount of light tension in the fine wire. In this manner the wires may be centered over each solder pad to insure good electrical connection may be made after soldering.

Guide 14 may be readily modified by exchanging shafts as required such that the proper number of paired o-rings are provided for the workpiece to be soldered. Additionally, spacing between the paired o-rings may be adjusted by changing the sizes of the o-rings if the diameter of the wire to be used is larger or smaller.

Also, if the tension to be applied to the wire is to be changed the spacing between the paired o-rings can be adjusted which will accordingly apply more or less gripping on a wire inserted therebetween.

When lacing wires around the individual loom cleats, a finger may be placed on all of the wires adjacent the gathering cleat. This would tend to reduce stress on a wiring while lacing the delicate wires around the individual posts. Proper tension is then kept on the wires by their securement between the paired o-rings. The properly aligned wires may then be connected to the solder pad by a variety of mechanisms including semiautomatic or automatic soldering stations.

In considering this invention it must be remembered that the disclosure is illustrative only and that the scope of the invention is to be determined by the appended claims.

What is claimed is:

1. Apparatus for a plurality of wires over solder pads on a workpiece, the apparatus comprising:
   (a) fixture means for rigidly supporting a workpiece such that solder pads on said workpiece are exposed; and
   (b) wire aligning means for positioning a plurality of wires over said workpiece such that a wire is centered over each solder pad, said wire aligning means including a lacette;
   (c) said lacette including a body constructed and arranged to engage a side of said workpiece adjacent a side of the workpiece having solder pads, said lacette further including a plurality of post members secured to said body and spaced such that when one post edge is aligned with the center of a solder pad, each solder pad is aligned with a separate post, wherein said wire aligning means further includes wire guide means for spacing a plurality of wires from each other, said wire guide means including a shaft member having a plurality of o-rings attached thereto at spaced intervals, said o-rings being arranged in pairs so as to define a wire aligning notch between each pair of o-rings.

2. The apparatus of claim 1 wherein said lacette is constructed and arranged such that said post members extend over the solder pad bearing surface of the workpiece.

3. The apparatus of claim 2 wherein said lacette post members are quarter-round in cross-section such that wires may make a ninety degree bend over a curved arc.

4. The apparatus of claim 2 wherein said fixture means includes a pivoting workpiece holder pivotally mounted to a base and lock means for locking said workpiece holder and workpiece adjacent said wire guide means.

* * * * *